(12) United States Patent
Kim

(10) Patent No.: US 6,214,702 B1
(45) Date of Patent: Apr. 10, 2001

(54) METHODS OF FORMING SEMICONDUCTOR SUBSTRATES USING WAFER BONDING TECHNIQUES AND INTERMEDIATE SUBSTRATES FORMED THEREBY

(75) Inventor: Yun-Gi Kim, Kangwon-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/277,088

(22) Filed: Mar. 26, 1999

(30) Foreign Application Priority Data

Mar. 30, 1998 (KR) .................................. 98-10988

(51) Int. Cl.⁷ .................................. H01L 21/46
(52) U.S. Cl. .................. 438/459; 438/465; 438/976; 257/640; 257/701
(58) Field of Search .................. 438/455, 459, 438/465, 779, 958, 976; 257/632, 639, 640, 701, 702

(56) References Cited

U.S. PATENT DOCUMENTS

| | | | |
|---|---|---|---|
| 4,671,846 | * 6/1987 | Shimbo et al. | 156/629 |
| 5,366,923 | * 11/1994 | Beyer et al. | 437/62 |
| 5,665,631 | * 9/1997 | Lee et al. | 438/459 |
| 5,750,000 | * 5/1998 | Yonehara et al. | 156/630.1 |
| 5,753,562 | * 5/1998 | Kim | 438/424 |

OTHER PUBLICATIONS

McNamara, J.M.; Raby, J.S.; Wafer Bonding Using Low Temperature Melting Glass. IEEE Proceeding of SOS/SOI Technology Workshop, 1988. p. 14.*

* cited by examiner

*Primary Examiner*—Olik Chaudhuri
*Assistant Examiner*—Ginette Peralta
(74) *Attorney, Agent, or Firm*—Myers Bigel Sibley & Sajovec

(57) ABSTRACT

Methods of forming semiconductor substrates include the steps of bonding a first semiconductor substrate to a second semiconductor substrate. The first semiconductor substrate has a first adhesion layer thereon extending opposite a first surface thereof and a first diffusion barrier layer extending between the first adhesion layer and the first surface. The second semiconductor substrate has a second adhesion layer thereon. The first diffusion barrier layer prevents impurities from within the first adhesion layer from diffusing directly into the first semiconductor substrate during subsequent thermal treatment steps (e.g., annealing). A second diffusion barrier layer is then formed to encapsulate the bonded wafers and the adhesion layers and diffusion barrier layer therebetween. The second diffusion barrier layer prevents impurities from within the adhesion layers from out-diffusing (from the lateral edges of the adhesion layers) during the subsequent thermal treatment steps (e.g., annealing steps). The second diffusion barrier layer may comprise silicon nitride or silicon oxynitride.

9 Claims, 2 Drawing Sheets

METHODS OF FORMING SEMICONDUCTOR SUBSTRATES USING WAFER BONDING TECHNIQUES AND INTERMEDIATE SUBSTRATES FORMED THEREBY

RELATED APPLICATION

This application is related to Korean Application No. 98-10988, filed Mar. 30, 1998, the disclosure of which is hereby incorporated herein by reference.

FIELD OF THE INVENTION

This invention relates to integrated circuit device fabrication methods and devices formed thereby, and more particularly to semiconductor substrate fabrication methods and substrates formed thereby.

BACKGROUND OF THE INVENTION

Wafer bonding techniques may be utilized to form semiconductor-on-insulator (SOI) substrates. Such techniques typically involve steps to form an electrically insulating layer on a first wafer and then bond the first wafer to a second wafer with the electrically insulating layer disposed therebetween and acting as an adhesion layer. One of the wafers may then be polished using conventional techniques to form a semiconductor active layer that is electrically isolated from the other wafer by the electrically insulating layer. An example of such a bonding technique is described in U.S. Pat. No. 5,753,562 to Kim, entitled "Methods of Forming Semiconductor Devices in Substrates Having Inverted-Trench Isolation Regions Therein", assigned to the present assignee, the disclosure of which is hereby incorporated herein by reference.

Recently, BPSG (borophosphosilicate glass) layers have been considered as adhesion material layers. When such layers are used in an SOI process, annealing steps may be performed at temperatures less than 850° C. to increase bond strength. However, during such annealing steps to increase bond strength, impurities and contaminants can out-diffuse from the BPSG layer and into the first and second wafers where they may adversely influence the electrical characteristics of devices subsequently formed therein.

Referring now to FIG. 1, a cross-sectional view of a conventional semiconductor substrate (e.g., SOI substrate) will be described. In particular, the substrate of FIG. 1 includes a processing wafer 10 (wherein a variety of active semiconductor devices are to be formed), a handling wafer 12, a BPSG layer 14 and a silicon nitride layer 13. As will be understood by those skilled in the art, the BPSG layer 14 acts as an adhesion layer and the silicon nitride layer 13 acts as a diffusion barrier layer to inhibit direct transfer of boron and phosphorus impurities from the BPSG layer 14 to the processing wafer 10 during subsequent thermal treatment steps (e.g., annealing).

In order to increase the degree of bonding (i.e., bond strength) between the processing and handling wafers 10 and 12, an annealing step is typically carried out at temperature of about 950° C. However, during such an annealing step, phosphorous and boron impurities may diffuse out from the ends of the BPSG layer 14 (as illustrated by the arrows in FIG. 1) and contaminate the bonded wafers 10 and 12. When these contaminated wafers are then loaded into new manufacturing apparatus, the manufacturing apparatus and handling devices may also become contaminated with boron and phosphorous impurities.

To solve these contamination problems, attempts have been made to use adhesion materials other than BPSG. For example, undoped silicate glass (USG) has been considered as an alternative to BPSG. Unfortunately, USG typically does not provide a sufficiently strong bond between wafers. Attempts to increase the bond strength of USG have included increasing the annealing temperature, but such increases in annealing temperature can produce parasitic voids in the bond interface. Thus, notwithstanding the above described methods of bonding wafers and forming SOI substrates, there continues to be a need for improved wafer bonding methods which are more suitable for forming SOI substrates.

SUMMARY OF THE INVENTION

It is therefore an object of the present invention to provide improved methods of forming integrated circuit substrates.

It is another object of the present invention to provide methods of forming semiconductor-on-insulator substrates that have reduced susceptibility to contamination related defects.

These and other objects, advantages and features of the present invention are provided by methods of forming integrated circuit substrates that comprise the step of bonding a first semiconductor substrate to a second semiconductor substrate. The first semiconductor substrate has a first adhesion layer thereon extending opposite a first surface thereof and a first diffusion barrier layer extending between the first adhesion layer and the first surface. The second semiconductor substrate has a second adhesion layer thereon. The first diffusion barrier layer may comprise a silicon nitride layer formed using a low pressure chemical vapor deposition (LPCVD) technique with $NH_3$ and dichlorosilane (DCS). The first adhesion layer may also comprise a borophosphosilicate glass (BPSG) layer. The first diffusion barrier layer prevents impurities from within the first adhesion layer from diffusing directly into the first semiconductor substrate during subsequent thermal treatment steps (e.g., annealing). The second adhesion layer may also be formed of BPSG.

In order to increase the strength of the chemical bond between the first semiconductor substrate and the second semiconductor substrate, an annealing step should be carried out. The annealing step may be carried out in a nitrogen ambient for about 30 minutes at temperature of about 900° C. According to a preferred aspect of the present invention, a second diffusion barrier layer is then formed to encapsulate the bonded wafers and the adhesion layers and diffusion barrier layer therebetween. The second diffusion barrier layer prevents impurities from within the adhesion layers from out-diffusing (from the lateral edges of the adhesion layers) during the subsequent thermal treatment steps (e.g., annealing steps). The second diffusion barrier layer may comprise silicon nitride or silicon oxynitride.

An additional annealing step may be carried out to further improve the bond strength between the substrates. This annealing step may be carried out in a nitrogen ambient, for a duration of about 30 minutes and at temperature about 950° C. After this final annealing step, a second surface of the first semiconductor substrate may be polished (e.g., using CMP) to form an active semiconductor layer. Active semiconductor devices may then be formed in the active semiconductor layer.

DESCRIPTION OF PREFERRED EMBODIMENTS

Figure 1:
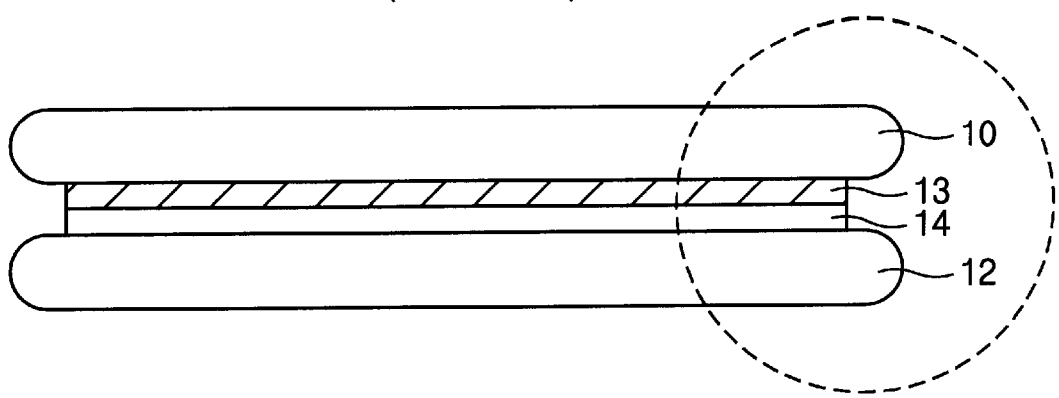
FIG. 1 is a cross-sectional view of a semiconductor substrate according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2A:
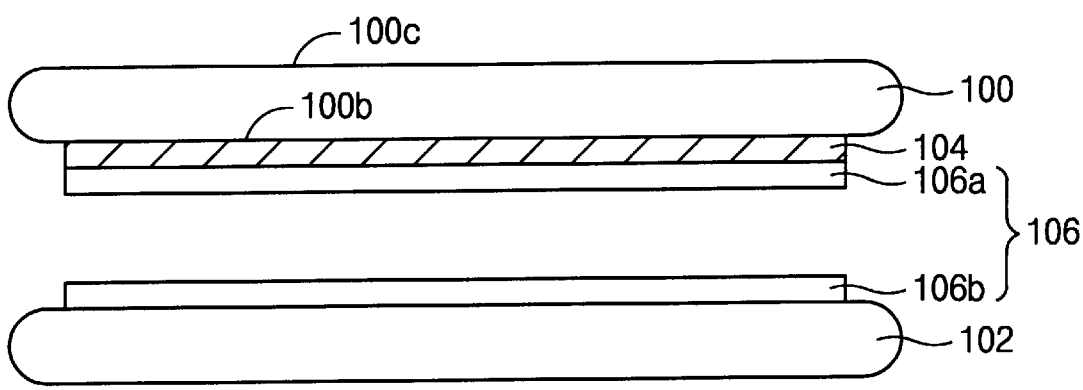
FIGS. 2A–2D are cross-sectional views of intermediate structures which illustrate preferred methods of forming semiconductor substrates according to a preferred embodiment of the present invention.
Figure 2B:
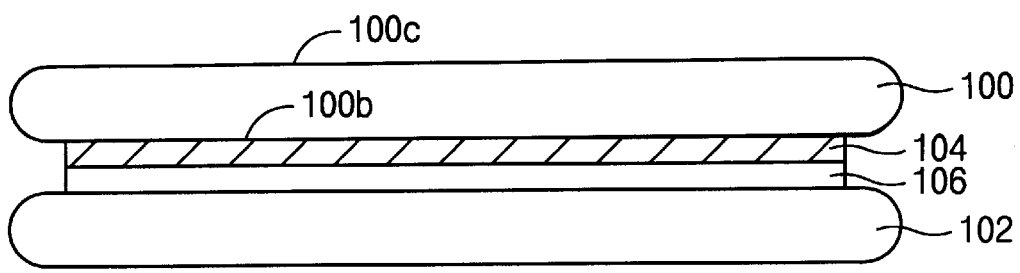

Referring now to FIGS. 2A–2D, preferred methods of forming semiconductor substrates will be described. In particular, FIG. 2A illustrates the step of bonding a first semiconductor substrate 100 (e.g., wafer) to a second semiconductor substrate 102. As illustrated, the first semiconductor substrate has a first adhesion layer 106a thereon extending opposite a first surface 100b thereof and a first diffusion barrier layer 104 extending between the first adhesion layer 106a and the first surface 100b. The second semiconductor substrate 102 has a second adhesion layer 106b thereon. The first diffusion barrier layer 104 may comprise a silicon nitride layer formed using a low pressure chemical vapor deposition (LPCVD) technique with $NH_3$ and dichlorosilane (DCS) at a temperature of about 780° C. The first diffusion barrier layer 104 may be formed to a thickness of about 70 Å to 2000 Å. The first adhesion layer 106a may also comprise a borophosphosilicate glass (BPSG) layer formed at a temperature of about 420° C. The BPSG layer may also have a boron concentration of 4.8% by weight and a phosphorus concentration of 7.2% by weight therein. Preferably, the first diffusion barrier layer 104 prevents impurities (e.g., boron and phosphorous) from within the first adhesion layer 106a from diffusing directly into the first semiconductor substrate 100 during subsequent thermal treatment steps (e.g., annealing). The second adhesion layer 106b may also be formed of BPSG in a similar manner on the second semiconductor substrate 102. Alternatively, the adhesion layers 106a and 106b may comprise BSG (boron silicate glass) or PSG (phosphorous silicate glass). When bonded, these adhesion layers may have a combined thickness of about 350 Å.

In order to increase the strength of the chemical bond between the first semiconductor substrate 100 and the second semiconductor substrate 102, an annealing step should be carried out. The annealing step may be carried out in a nitrogen ambient for about 30 minutes at temperature of about 900° C. Prior to the annealing step, an initial bonding step may also be carried out in a vacuum bonding apparatus at room temperature and at a pressure level of about $10^{-3}$ Torr.

Figure 2C:
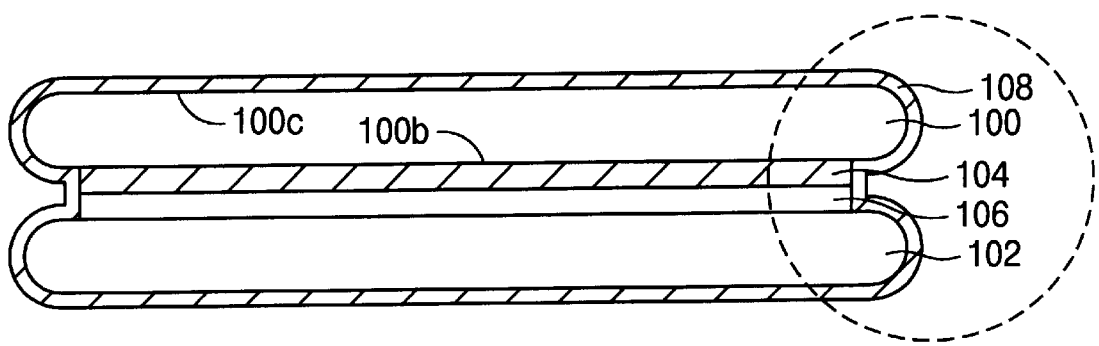

Referring now to FIG. 2C, a second diffusion barrier layer 108 is then formed to encapsulate the bonded wafers 100 and 102 and the adhesion layers and diffusion barrier layer therebetween, as illustrated. According to a preferred aspect of the present invention, the second diffusion barrier layer 108 prevents impurities from within the adhesion layers from out-diffusing (from the lateral edges of the adhesion layers) during the subsequent thermal treatment steps (e.g., annealing steps). The second diffusion barrier layer 108 also prevents out-diffusion of other impurities (including sodium (Na) ions) when the adhesion layers are contaminated by such impurities. The second diffusion barrier layer 108 may comprise silicon nitride or silicon oxynitride and may be formed to have a thickness in a range between 70 Å and 2000 Å using a LPCVD technique at a temperature of about 780° C. and in an ambient containing $NH_3$ and DCS. The second diffusion barrier layer 108 may also comprise a polysilicon layer or a high temperature oxide (HTO) layer when PSG is used to form the adhesion layers.

Figure 2D:
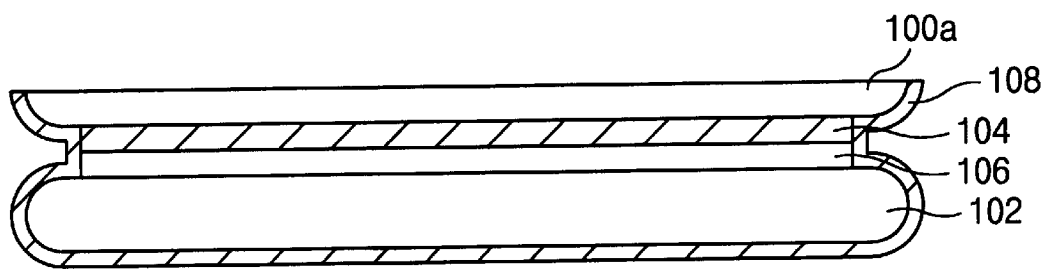

Referring now to FIG. 2D, an additional annealing step may be carried out to further improve the bond strength between the substrates 100 and 102. This annealing step may be carried out in a nitrogen ambient, for a duration of about 30 minutes and at temperature about 950° C. After this final annealing step, a second surface 100c of the first semiconductor substrate 100 may be polished (e.g., using CMP) to form an active semiconductor layer 100a. Active semiconductor devices may then be formed in the active semiconductor layer 100a.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor substrate, comprising the steps of:
    bonding a first semiconductor substrate having a first adhesion layer thereon extending opposite a first surface thereof and a first diffusion barrier layer extending between the first adhesion layer and the first surface, to a second semiconductor substrate having a second adhesion layer thereon, said first adhesion layer comprising a material having N-type and/or P-type dopants therein; and then
    forming a second diffusion barrier layer at least on edges of the first and second adhesions layers, said second diffusion barrier layer comprising a nitride material that blocks out-diffusion of the dopants from said first adhesion layer.

2. The method of claim 1, wherein said bonding step comprises contacting the first and second adhesion layers together and annealing the first and second adhesion layers simultaneously.

3. The method of claim 2, wherein said step of forming a second diffusion barrier layer comprises forming a second diffusion barrier layer at least on edges of the first and second adhesion layers and on a second surface of the first semiconductor substrate which extends opposite the first surface.

4. The method of claim 3, wherein the first and second adhesion layers comprise silicate glass layers selected from the group consisting of borophosphosilicate glass (BPSG), borosilicate glass (BSG) and phosphosilicate glass (PSG).

5. The method of claim 4, wherein said bonding step comprises the step of contacting the first and second adhesion layers together in a vacuum bonding apparatus at a temperature of at about room temperature.

6. The method of claim 2, wherein the annealing step is performed at below 900° C.

7. The method of claim 1, wherein the forming step is followed by the step of annealing the first and second semiconductor substrates at above 950° C.

8. The method according to claim 3, wherein the forming step is followed by the step of polishing a second surface of the first semiconductor substrate that is opposite the first surface to produce an active semiconductor layer.

9. The method of claim 4, wherein the first and second adhesion layers comprise PSG and wherein the second diffusion barrier layer is selected from the group consisting of polycrystalline silicon and High Temperature Oxide (HTO).

* * * * *